US010499538B2

(12) United States Patent
Kai et al.

(10) Patent No.: US 10,499,538 B2
(45) Date of Patent: Dec. 3, 2019

(54) ELECTRONIC DEVICE

(71) Applicant: FANUC CORPORATION, Yamanashi (JP)

(72) Inventors: Yoshirou Kai, Yamanashi-ken (JP); Kouhei Yoshida, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/169,170

(22) Filed: Oct. 24, 2018

(65) Prior Publication Data

US 2019/0132989 A1 May 2, 2019

(30) Foreign Application Priority Data

Oct. 31, 2017 (JP) .................................. 2017-210895

(51) Int. Cl.
*H05K 7/20* (2006.01)
*F28F 3/02* (2006.01)

(52) U.S. Cl.
CPC .......... *H05K 7/20163* (2013.01); *F28F 3/02* (2013.01); *H05K 7/20409* (2013.01); *H05K 7/20972* (2013.01)

(58) Field of Classification Search
CPC combination set(s) only.
See application file for complete search history.

(56) References Cited

U.S. PATENT DOCUMENTS

| 1,988,926 | A | * | 1/1935 | Thomson | F16B 33/004 |
| | | | | | 470/11 |
| 2,936,015 | A | * | 5/1960 | Rapata | F16B 5/0233 |
| | | | | | 411/182 |
| 3,651,545 | A | * | 3/1972 | Hara | F16B 21/082 |
| | | | | | 24/305 |
| 3,688,635 | A | * | 9/1972 | Fegen | F16B 21/082 |
| | | | | | 174/138 A |
| 3,836,703 | A | * | 9/1974 | Coules | H05K 7/142 |
| | | | | | 174/138 D |
| 4,027,206 | A | * | 5/1977 | Lee | H05K 7/20909 |
| | | | | | 361/697 |
| 4,033,663 | A | * | 7/1977 | McCardell | H01R 4/34 |
| | | | | | 439/545 |
| 4,055,131 | A | * | 10/1977 | O'Brien | D05B 19/02 |
| | | | | | 112/445 |
| 4,521,827 | A | * | 6/1985 | Jordan | H01L 23/4006 |
| | | | | | 165/80.1 |
| 4,726,722 | A | * | 2/1988 | Wollar | F16B 19/1081 |
| | | | | | 174/138 D |
| 4,760,495 | A | * | 7/1988 | Till | F16B 5/0233 |
| | | | | | 174/138 D |

(Continued)

FOREIGN PATENT DOCUMENTS

| JP | H09509014 A | 9/1997 |
| JP | 10-92490 A | 4/1998 |

(Continued)

*Primary Examiner* — William H. Mayo, III
*Assistant Examiner* — Krystal Robinson
(74) *Attorney, Agent, or Firm* — Robert P. Michal, Esq.; Carter, DeLuca & Farrell LLP

(57) ABSTRACT

An electronic device has a heat sink configured to cool an electronic component on a circuit board. The heat sink and the circuit board are joined by snap-fitting.

8 Claims, 12 Drawing Sheets

(56) References Cited

U.S. PATENT DOCUMENTS

| | | | | |
|---|---|---|---|---|
| 4,899,256 | A * | 2/1990 | Sway-Tin | F02P 3/02 361/715 |
| 5,187,646 | A * | 2/1993 | Koch | G06K 7/0047 361/679.33 |
| 5,371,652 | A * | 12/1994 | Clemens | H01L 23/4093 361/704 |
| 5,384,940 | A * | 1/1995 | Soule | H01L 23/4093 24/453 |
| 5,502,887 | A * | 4/1996 | Gonzales | H05K 13/0491 29/758 |
| 5,520,471 | A * | 5/1996 | Leys | B41J 25/34 347/197 |
| 5,586,005 | A * | 12/1996 | Cipolla | H01L 23/3677 361/719 |
| 5,600,540 | A * | 2/1997 | Blomquist | H01L 23/4093 174/16.3 |
| 5,870,285 | A * | 2/1999 | Kosteva | H01L 23/4093 165/185 |
| 5,967,799 | A | 10/1999 | Arai | |
| 6,757,155 | B2 * | 6/2004 | Koike | H05K 5/0043 174/564 |
| 7,489,511 | B2 * | 2/2009 | Yang | H01L 23/4093 24/453 |
| 2003/0062195 | A1 * | 4/2003 | Arrigotti | H01L 23/4093 174/260 |
| 2008/0037225 | A1 | 2/2008 | Yang | |
| 2011/0026231 | A1 * | 2/2011 | Scordino | H05K 7/1417 361/759 |
| 2014/0240925 | A1 * | 8/2014 | Okuaki | H05K 7/20409 361/704 |
| 2017/0165821 | A1 * | 6/2017 | Naito | B25B 27/023 |

FOREIGN PATENT DOCUMENTS

| | | |
|---|---|---|
| JP | 11-297435 A | 10/1999 |
| JP | 2000-010665 A | 1/2000 |
| JP | 2000022059 A | 1/2000 |
| JP | 2001-311942 A | 11/2001 |
| JP | 2003229682 A | 8/2003 |
| JP | 2006269980 A | 10/2006 |
| JP | 2014093310 A | 5/2014 |
| JP | 2017-169357 A | 9/2017 |

* cited by examiner

FIG. 5
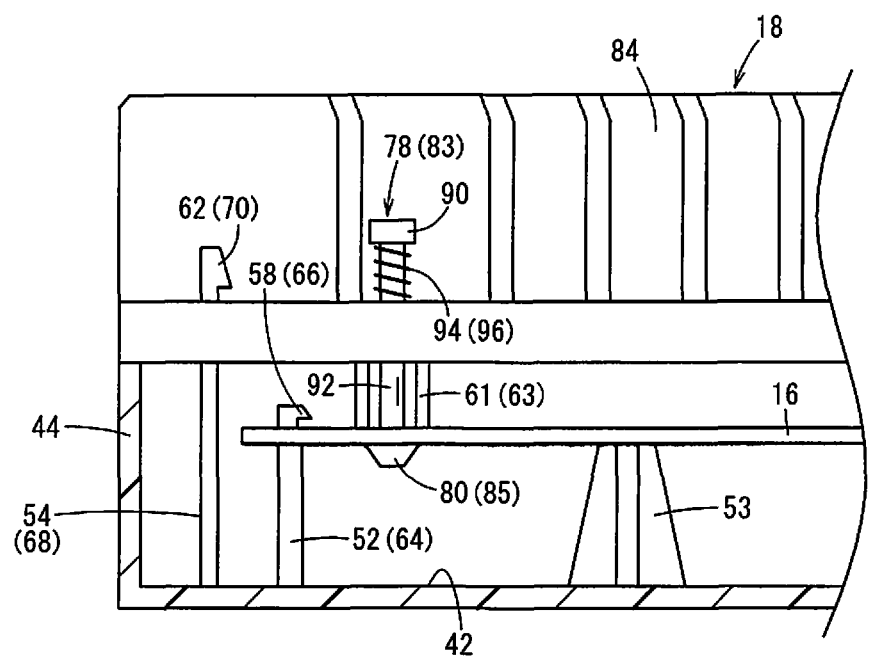
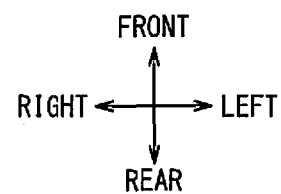

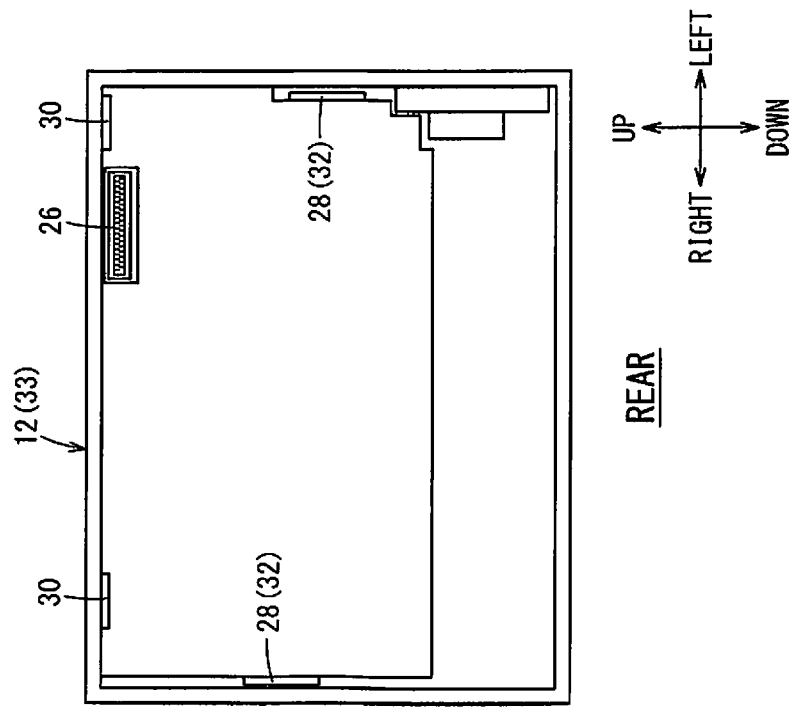
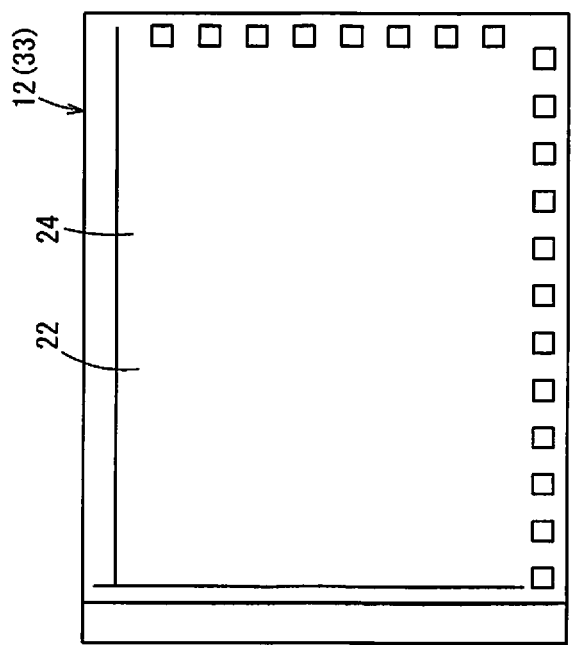

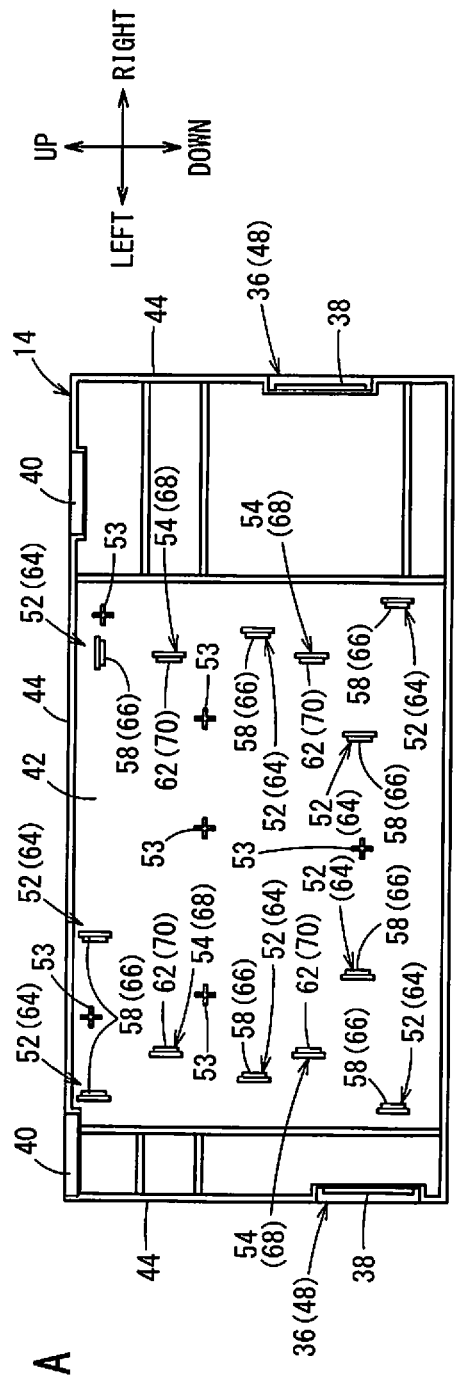
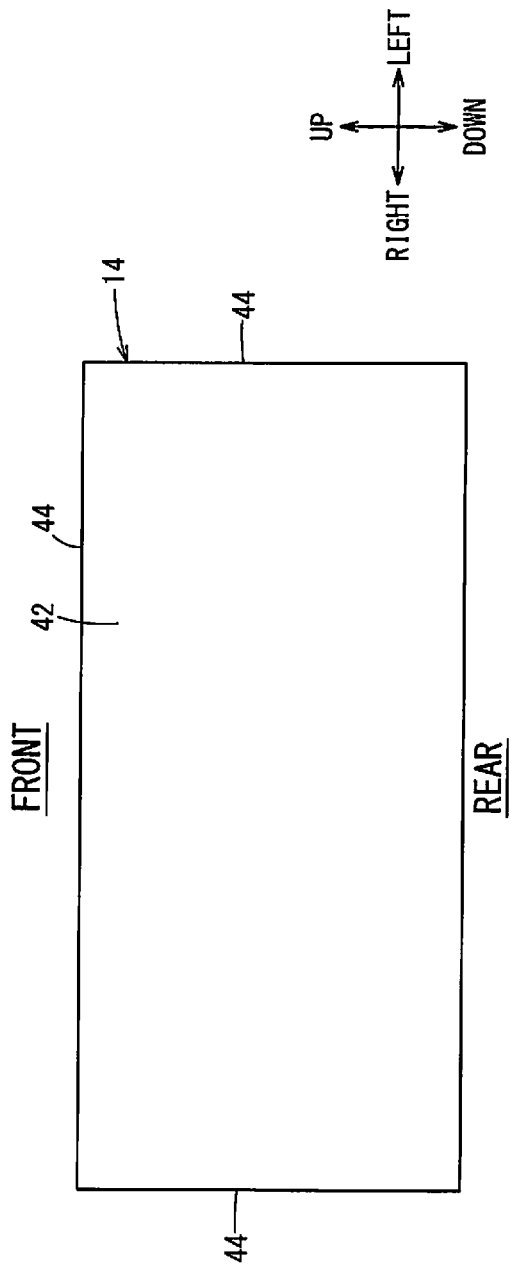
FIG. 7A
FIG. 7B

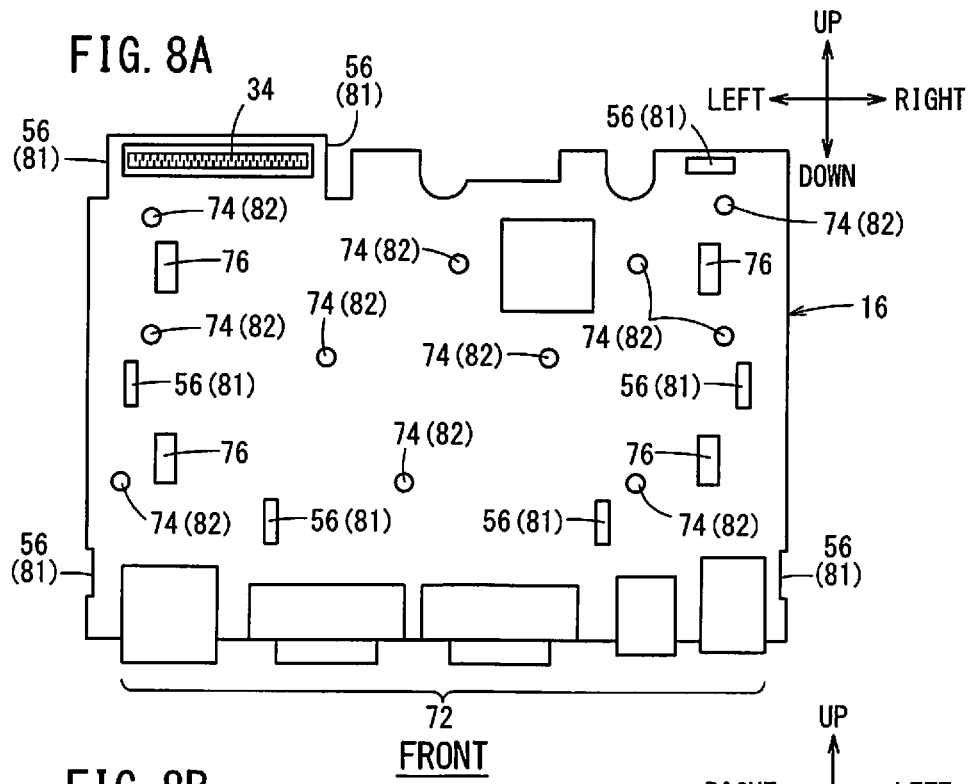
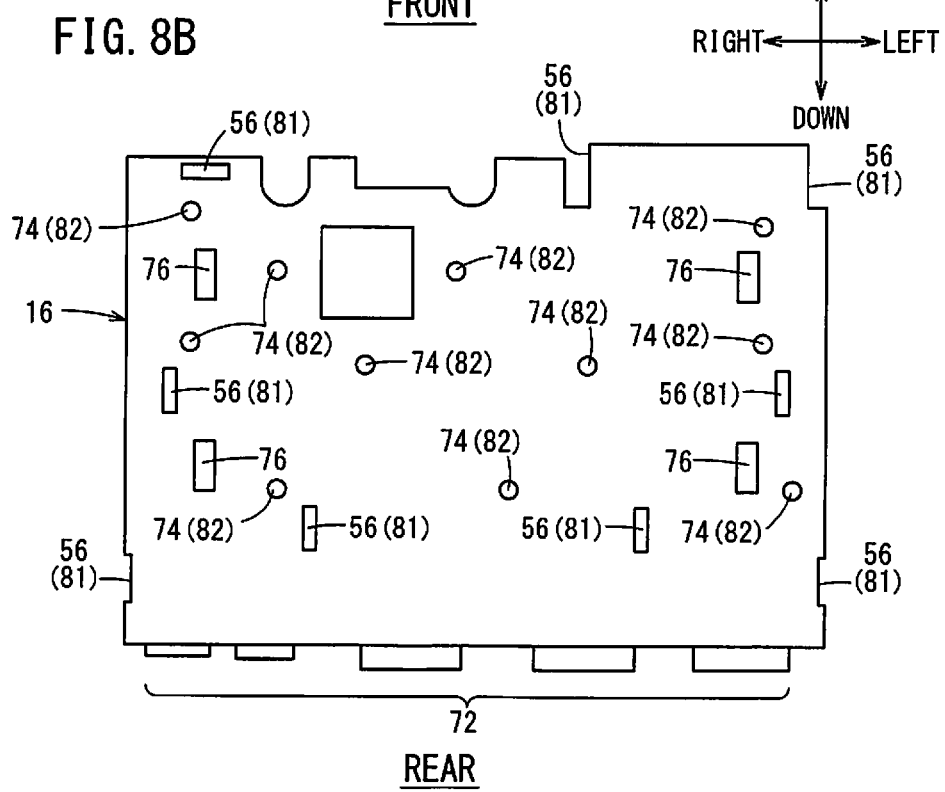

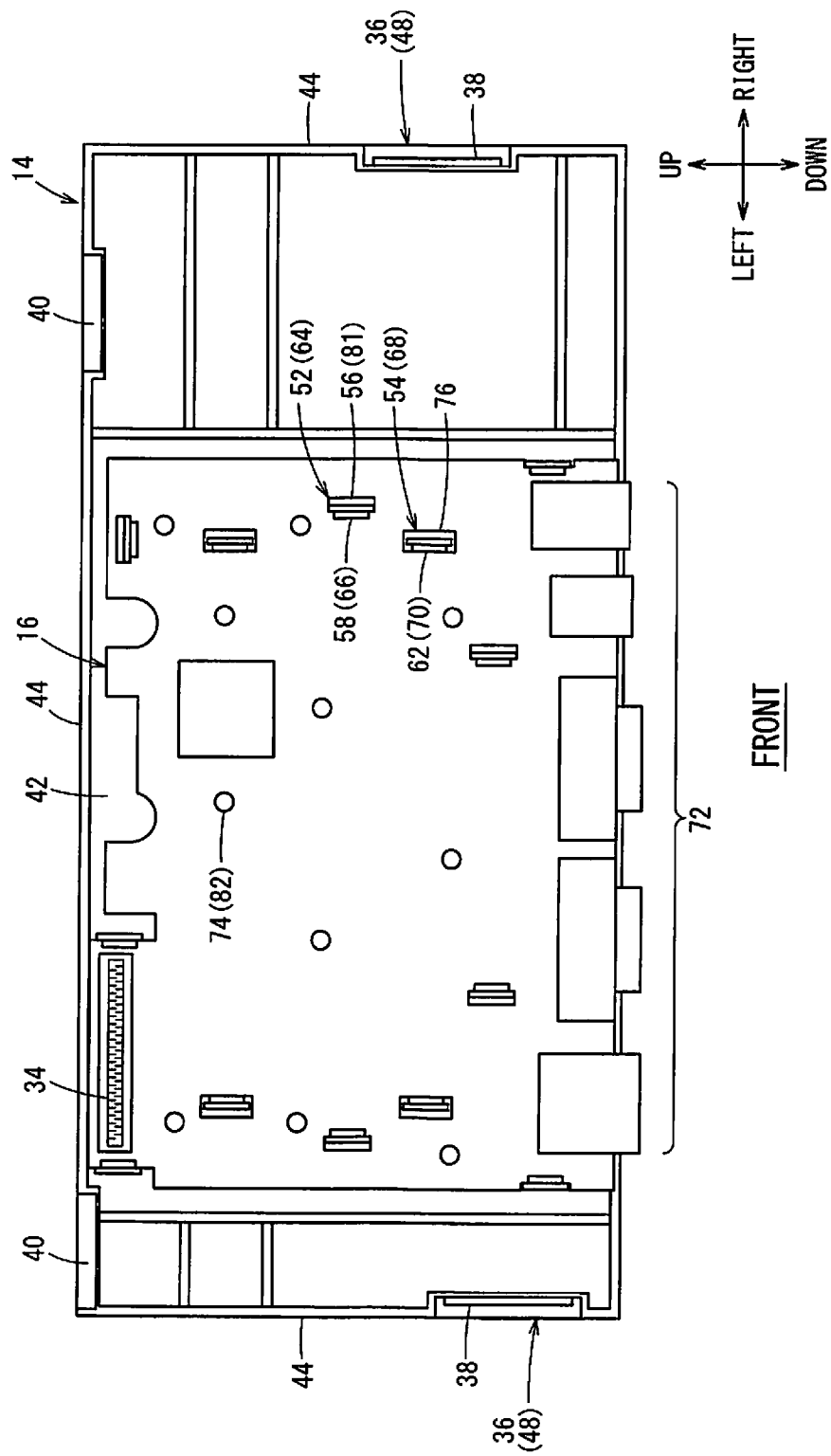

ELECTRONIC DEVICE

CROSS-REFERENCE TO RELATED APPLICATION

This application is based upon and claims the benefit of priority from Japanese Patent Application No. 2017-210895 filed on Oct. 31, 2017, the contents of which are incorporated herein by reference.

BACKGROUND OF THE INVENTION

Field of the Invention

The present invention relates to an electronic device having a heat sink.

Description of the Related Art

Japanese Laid-Open Patent Publication No. 2017-169357 discloses an electric-power conversion device in which a circuit board is fixed by a screw to a base portion of a heat sink.

SUMMARY OF THE INVENTION

When manufacturing the electric-power conversion device described in Japanese Laid-Open Patent Publication No. 2017-169357, the circuit board is fixed by a screw to the base portion of the heat sink, hence there has been a problem that a screwdriver or the like for tightening the screw becomes required, manufacturing steps become complicated, and manufacturing becomes difficult.

The present invention has been made in order to solve the above-described problem, and has an object of providing an electronic device which makes it possible to simplify manufacturing process of the electronic device.

According to an aspect of the present invention, there is provided an electronic device having a heat sink configured to cool an electronic component on a circuit board, in which the heat sink and the circuit board are joined by snap-fitting.

Due to the present invention, simplification of manufacturing process of the electronic device can be achieved.

The above and other objects, features, and advantages of the present invention will become more apparent from the following description when taken in conjunction with the accompanying drawings, in which a preferred embodiment of the present invention is shown by way of illustrative example.

BRIEF DESCRIPTION OF THE DRAWINGS

FIG. 5 is a partial cross-sectional view of the housing, a circuit board, and a heat sink;

FIG. 6A is a front view of a touch panel display of the display device, and FIG. 6B is a rear view of the touch panel display of the display device;

FIG. 7A is a front view of the housing, and FIG. 7B is a rear view of the housing;

FIG. 8A is a front view of the circuit board of the display device, and FIG. 8B is a rear view of the circuit board of the display device;

FIG. 10 is a front view of a state where the circuit board has been installed in the housing;

DESCRIPTION OF THE PREFERRED EMBODIMENTS

First Embodiment

[Configuration of Display Device]

Figure 1:
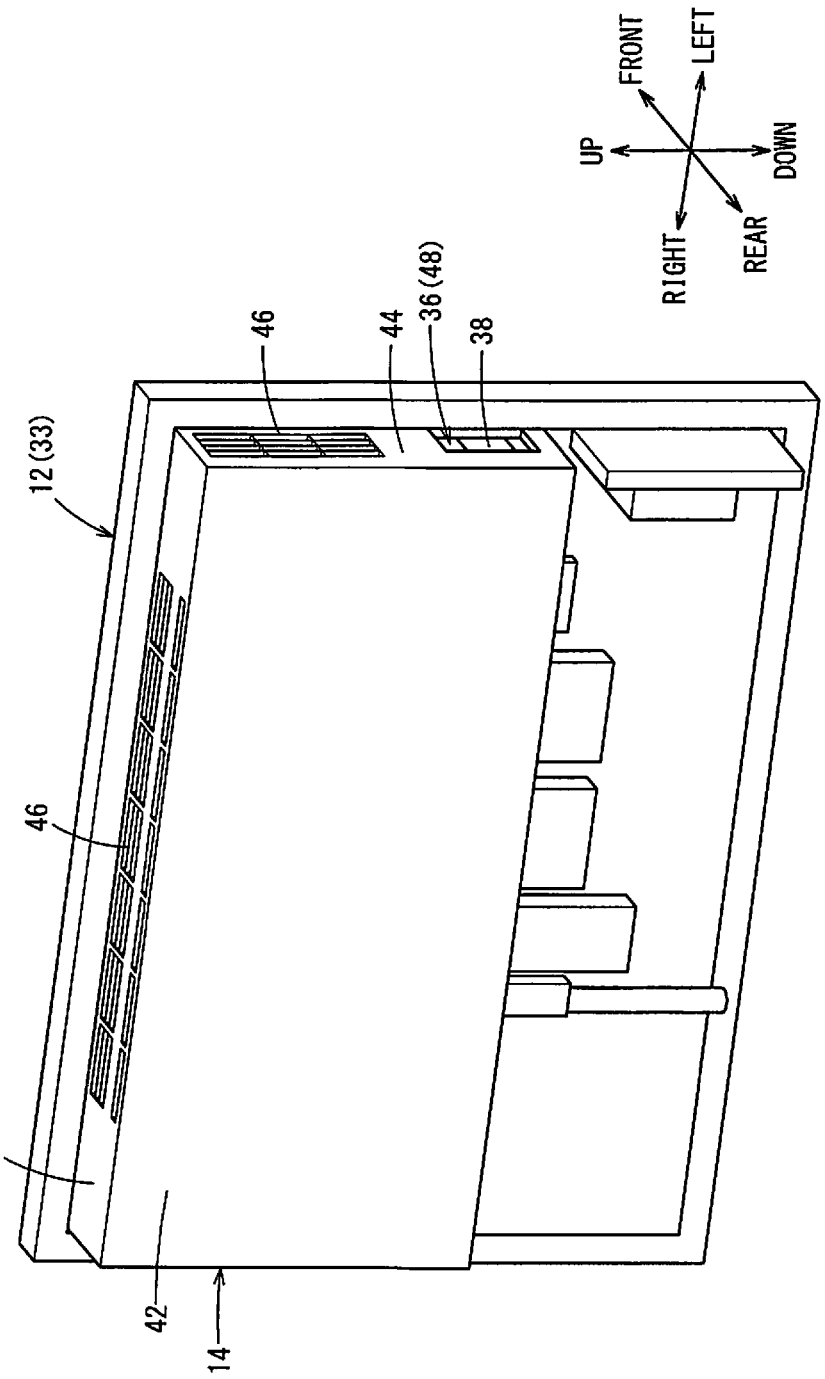
FIG. 1 is a perspective view of a display device.
Figure 2:
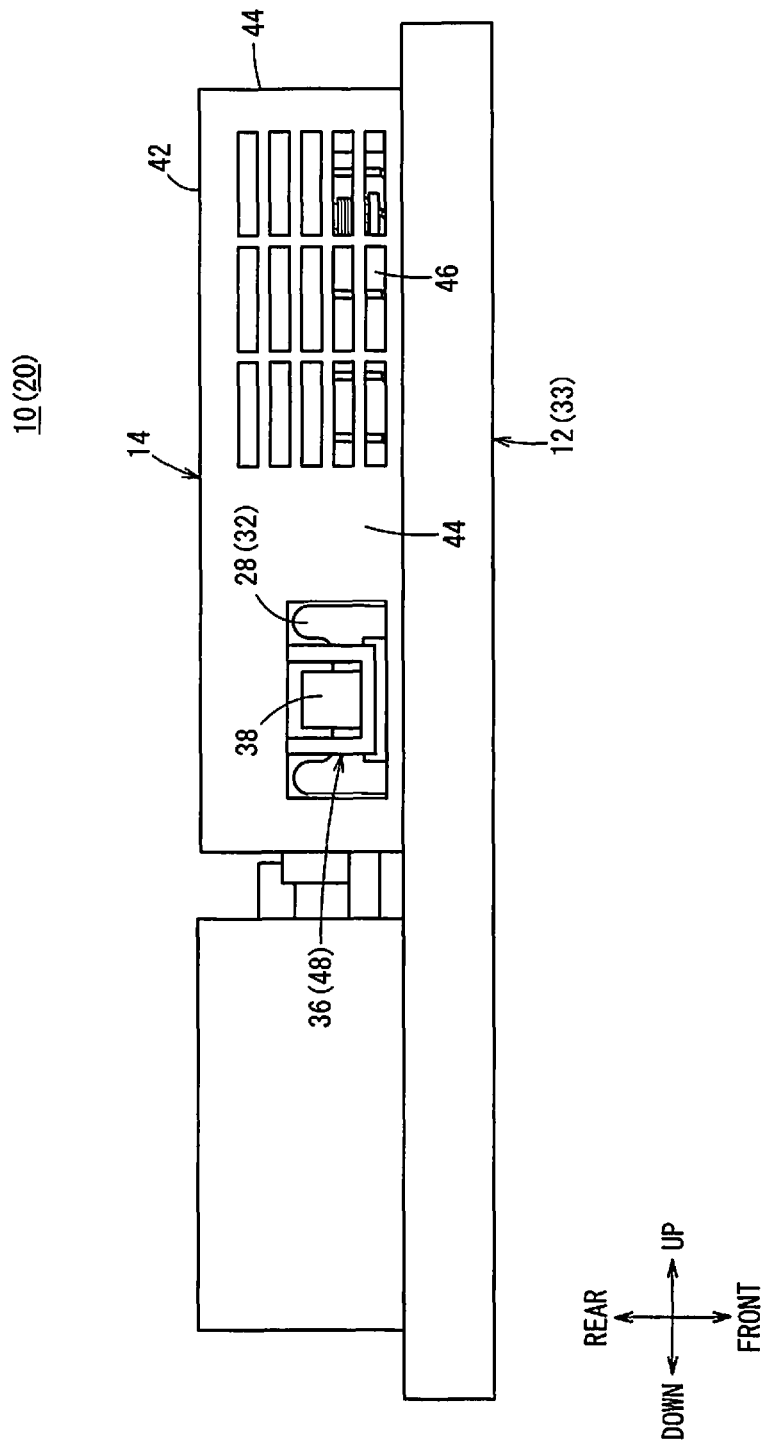
FIG. 2 is a side view of the display device
Figure 3:
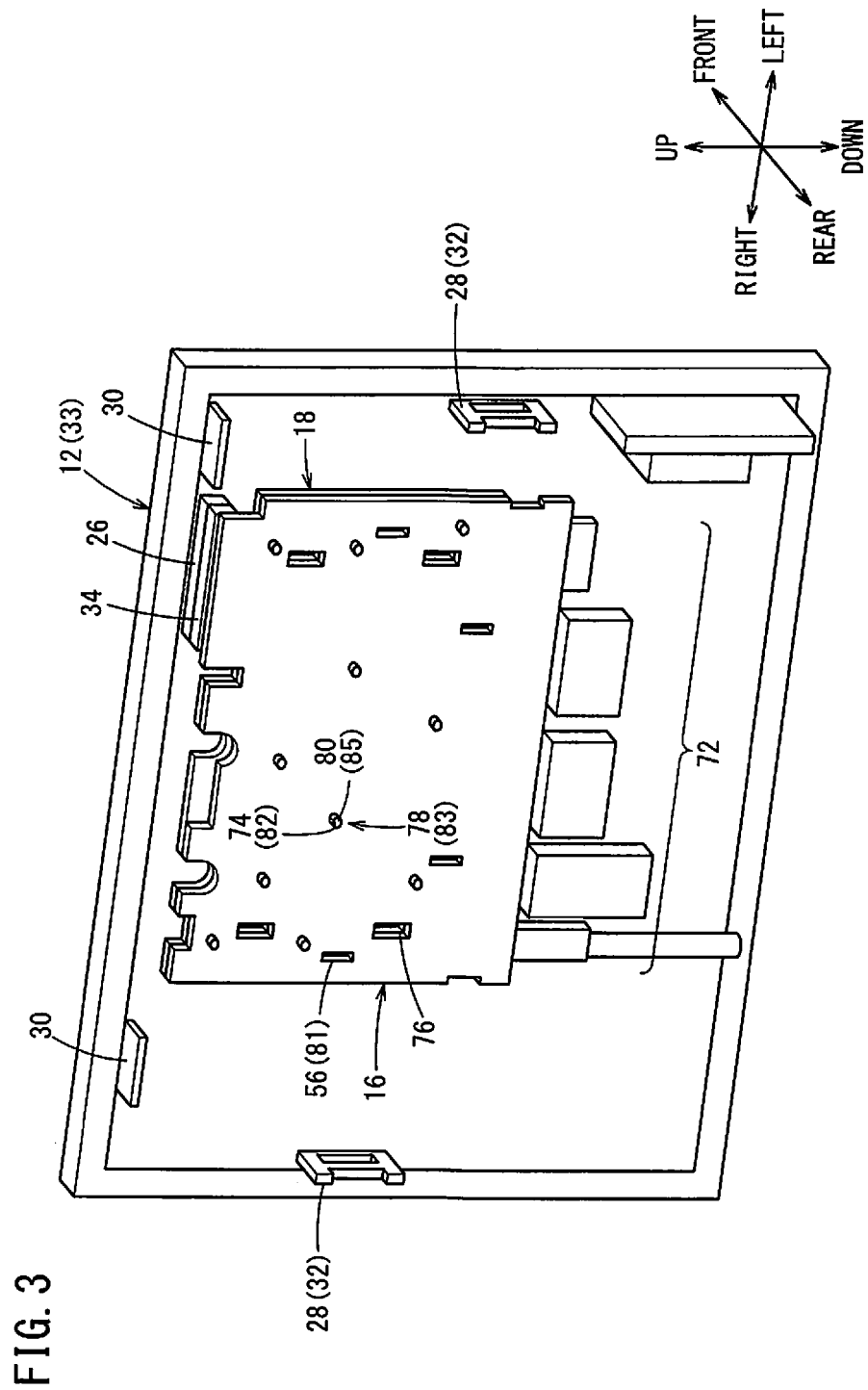
FIG. 3 is a perspective view of a state where a housing has been removed from the display device.
Figure 4:
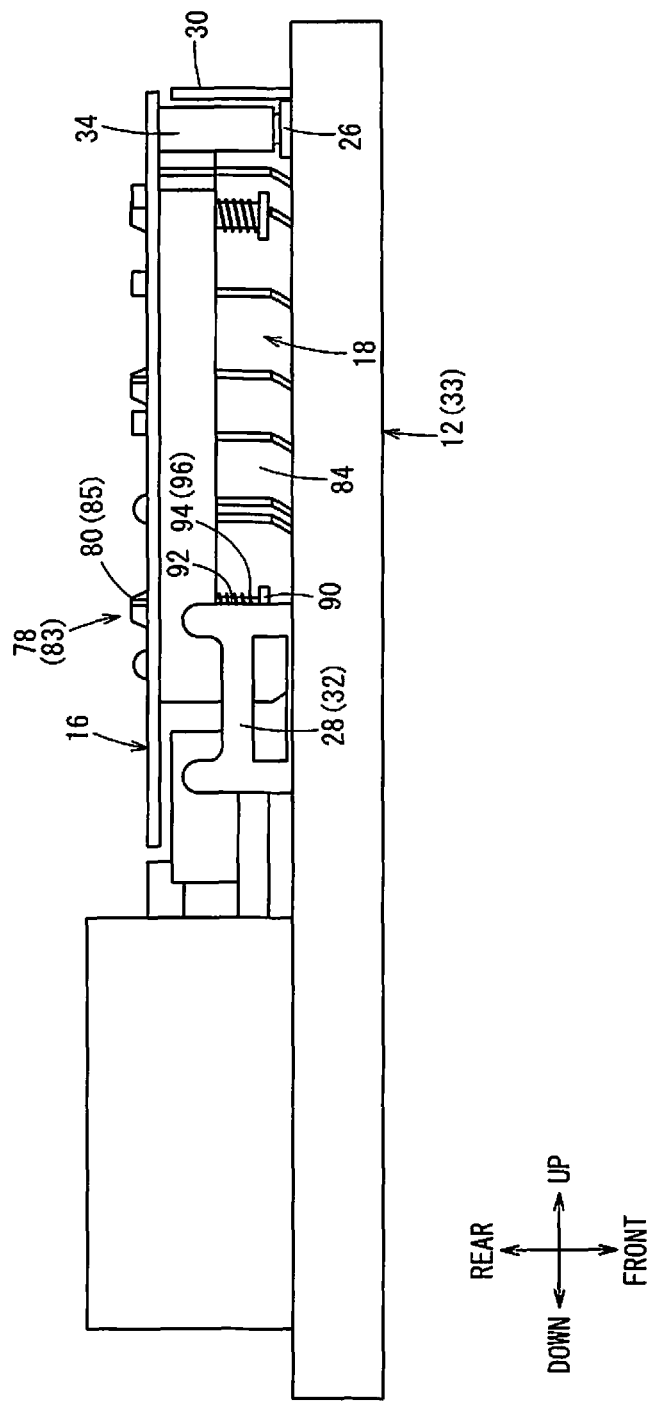
FIG. 4 is a side view of the state where the housing has been removed from the display device.

A display device 10 of the present embodiment includes a touch panel display 12, a housing 14, a circuit board 16, and a heat sink 18. The display device 10 configures an electronic device 20. FIG. 1 is a perspective view of the display device 10. FIG. 2 is a side view of the display device 10. FIG. 3 is a perspective view of a state where the housing 14 has been removed from the display device 10. FIG. 4 is a side view of the state where the housing 14 has been removed from the display device 10. FIG. 5 is a partial cross-sectional view of the housing 14, the circuit board 16, and the heat sink 18.

Figure 9A:
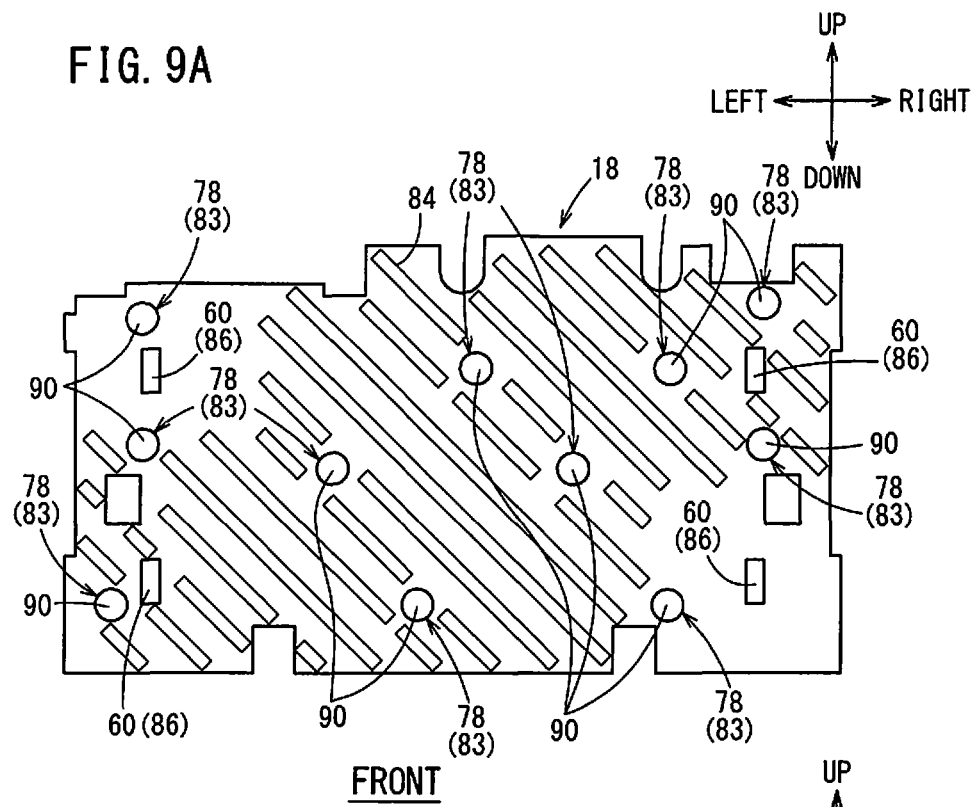
FIG. 9A is a front view of the heat sink of the display device.
Figure 9B:
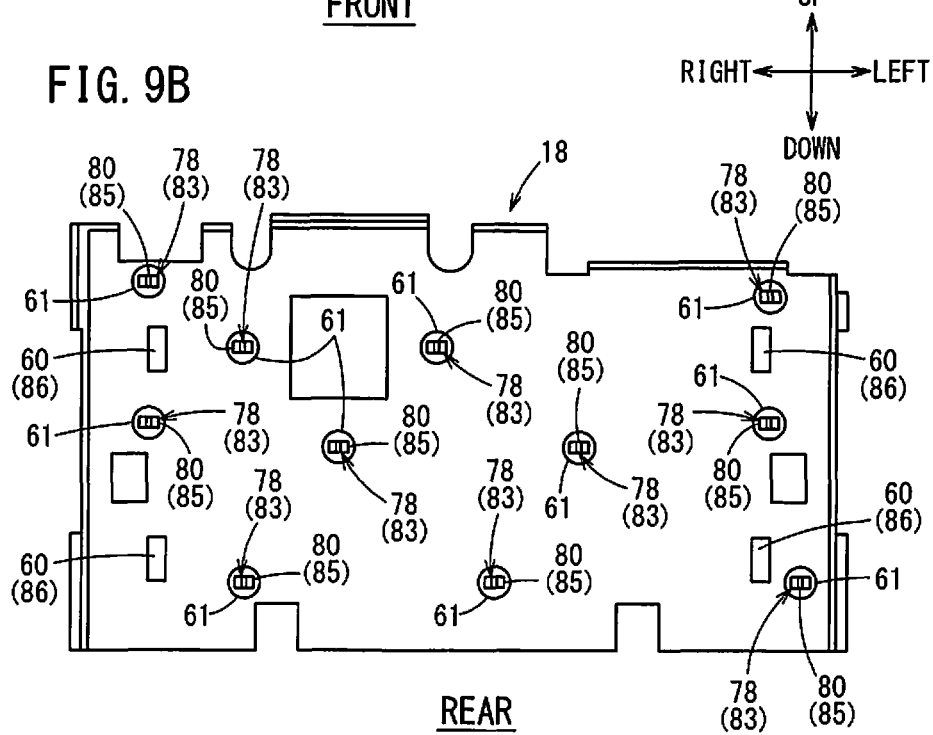
FIG. 9B is a rear view of the heat sink of the display device.

FIG. 6A is a front view of the touch panel display 12 of the display device 10. FIG. 6B is a rear view of the touch panel display 12 of the display device 10. FIG. 7A is a front view of the housing 14. FIG. 7B is a rear view of the housing 14. FIG. 8A is a front view of the circuit board 16 of the display device 10. FIG. 8B is a rear view of the circuit board 16 of the display device 10. FIG. 9A is a front view of the heat sink 18 of the display device 10. FIG. 9B is a rear view of the heat sink 18 of the display device 10.

Figure 11:
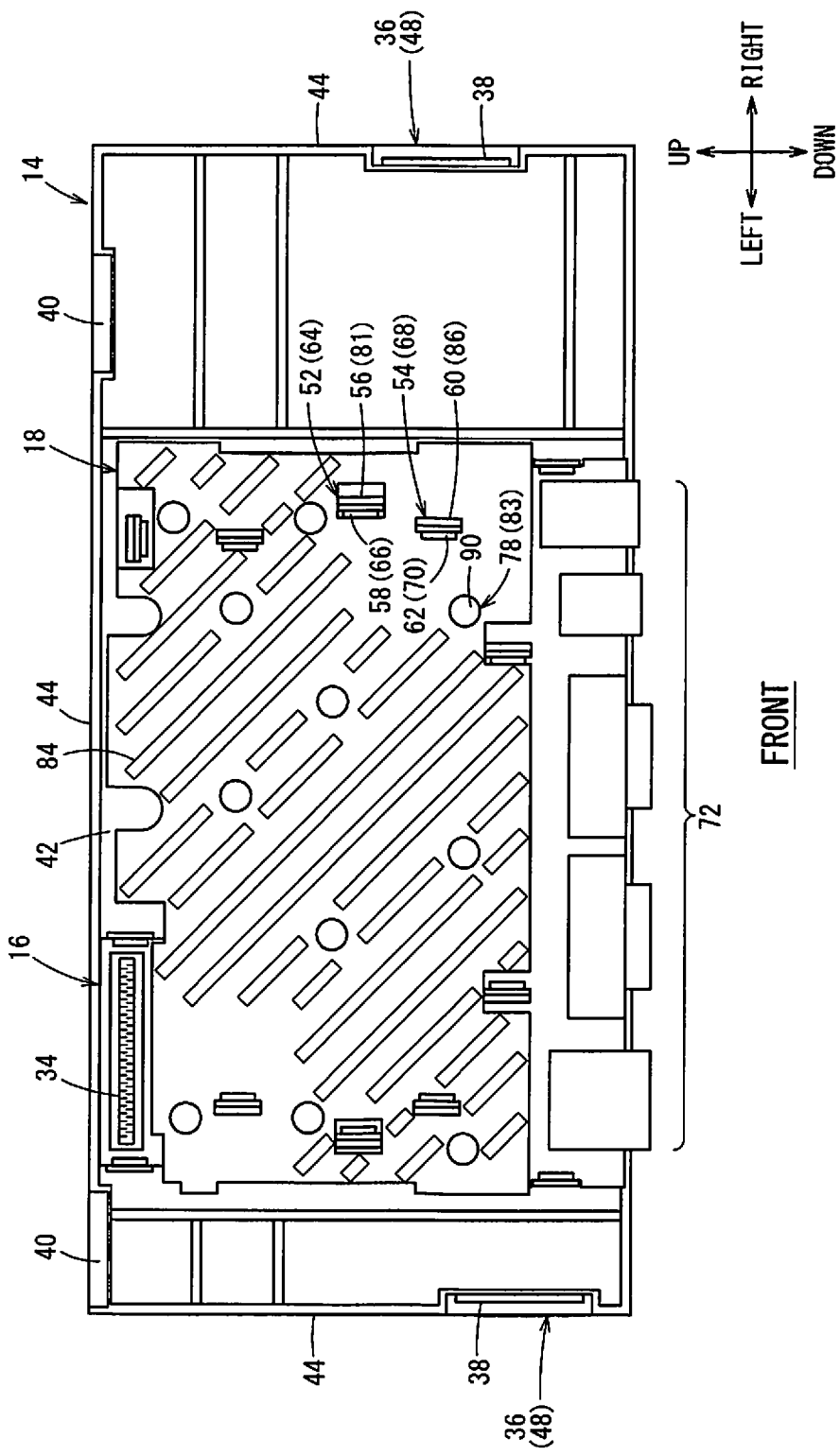
FIG. 11 is a front view of a state where the circuit board and the heat sink have been installed in the housing.
Figure 12:
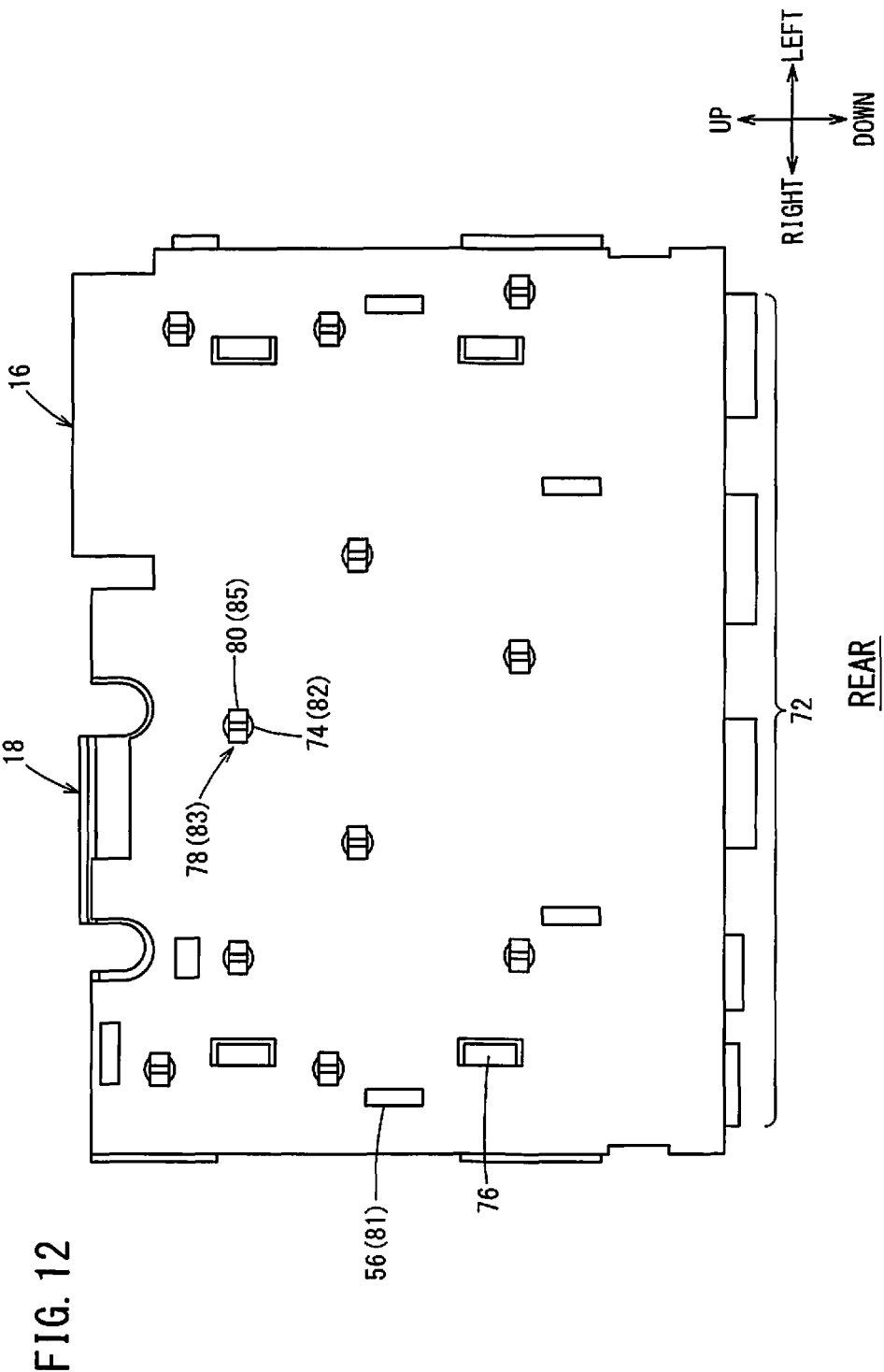
FIG. 12 is a rear view of a state where the circuit board has been installed in the heat sink.

FIG. 10 is a front view showing a state where the circuit board 16 has been installed in the housing 14. FIG. 11 is a front view showing a state where the circuit board 16 and the heat sink 18 have been installed in the housing 14. FIG. 12 is a rear view showing a state where the circuit board 16 has been installed in the heat sink 18. Note that in FIGS. 3, 4, and 10 to 12, some of the reference symbols are omitted to make the drawings easy to see.

Hereinafter, a touch panel display 12 side of the display device 10 in FIG. 1 will be described as front, and its housing 14 side will be described as rear. In description of the touch panel display 12, the housing 14, the circuit board 16, and the heat sink 18 too, in a state where these have been installed as the display device 10, their touch panel display 12 side will be described as front and their housing 14 side will be described as rear. Moreover, hereafter, an upper side of the display device 10 in FIG. 1 will be described as up, and its lower side will be described as down. Moreover, a left side of the display device 10 when viewed from the front will be described as left, and its right side will be described as right. However, the display device 10 is not limited to having to be used in a state where it has been installed as in FIG. 1.

The touch panel display 12 includes: a liquid crystal panel 22 as a display screen of the touch panel display 12; and a transparent sheet-shaped touch panel 24 stuck on to the liquid crystal panel 22 (FIGS. 6A and 6B). Note that there need not be the touch panel display 12, and, in that case, there may be the liquid crystal panel 22 only. Moreover, there is no limitation to there being the liquid crystal panel 22, and there may be an organic electroluminescence panel (organic EL panel), or the like. The rear of the touch panel display 12 is provided with the circuit board 16 that has mounted thereon electronic components or the like for controlling the touch panel display 12. The heat sink 18 for cooling the electronic components or the like on the circuit board 16, is provided between the touch panel display 12 and the circuit board 16 (FIG. 4). The housing 14 is fixed to the rear of the touch panel display 12 in a state where the circuit board 16 and the heat sink 18 are housed in the housing 14 (FIGS. 1 and 2).

The rear of the touch panel display 12 is provided with: a male side connector 26 for electrically connecting to the circuit board 16; a hook 28 for fixing the housing 14; and a positioning plate 30 that regulates a position of the housing 14 with respect to the touch panel display 12 (FIGS. 3, 4, 6A, and 6B). The hook 28 configures a fourth hook 32. Moreover, the touch panel display 12 configures a main body 33.

The connector 26 is disposed in an upper section of the touch panel display 12, when the touch panel display 12 is viewed from its rear side. The connector 26 is disposed such that by the circuit board 16 being pressed from the rear side against the touch panel display 12, the connector 26 is inserted in a later-mentioned female side connector 34 of the circuit board 16. As a result, the touch panel display 12 and the circuit board 16 are electrically connected in a manner enabling them to communicate with each other. Note that the connector 34 is desirably a floating connector in order to improve guiding-in, absorption of position displacement, and insertion characteristics during connection of the connector 26.

The hook 28 is disposed in an outer peripheral portion on both left and right sides of the touch panel display 12, when the touch panel display 12 is viewed from its rear side. The hook 28 is provided upright with respect to the rear surface of the touch panel display 12. The hook 28 engages with a later-mentioned claw portion 36 of the housing 14 by the housing 14 being pressed from the rear side against the touch panel display 12.

The positioning plate 30 is disposed in two places on an upper side of the touch panel display 12, when the touch panel display 12 is viewed from its rear side. The positioning plate 30 is provided upright with respect to the rear surface of the touch panel display 12. The positioning plate 30 is inserted in a later-mentioned positioning hole 40 of the housing 14, when the housing 14 is installed in the rear of the touch panel display 12.

The housing 14 includes a bottom surface 42 and side wall surfaces 44 that are provided upright on the bottom surface 42 (FIGS. 1, 2, 7A, 7B, 10, and 12). The side wall surfaces 44 are provided on a front side of the bottom surface 42 facing the touch panel display 12, and are provided respectively on an upper side and both of left and right sides, when the housing 14 is viewed from its front side. The side wall surface 44 on the upper side and the side wall surfaces 44 on both left and right sides, are substantially orthogonal to each other. Each of the side wall surfaces 44 has formed therein a communicating port 46 that communicates an outside and an inside of the housing 14. Moreover, a lower section of the housing 14 is open. As a result, air on the inside of the housing 14 can be exchanged (supplied and discharged) in an up-down direction and a left-right direction of the housing 14.

The side wall surfaces 44 on left and right sides when the housing 14 is viewed from its front side, each have the claw portion 36 having an operating portion 38 and which engages with the hook 28 of the touch panel display 12 (FIGS. 1, 2, 7A, 10, and 11). The side wall surface 44 on the upper side when the housing 14 is viewed from its front side, has formed therein the positioning holes 40 in which the positioning plates 30 of the touch panel display 12 are inserted (FIGS. 7A, 10, and 11). Note that the claw portion 36 configures a fourth claw portion 48.

As previously mentioned, by the housing 14 being pressed from the rear side against the touch panel display 12, the claw portion 36 of the housing 14 and the hook 28 of the touch panel display 12 engage with each other, whereby the housing 14 is fixed to the touch panel display 12. When removing the housing 14 from the touch panel display 12, the operating portion 38 is pressed inwardly, thereby releasing engagement of the claw portion 36 of the housing 14 and the hook 28 of the touch panel display 12.

The housing 14 includes: a hook 52 for fixing the circuit board 16 to the housing 14; a leg portion 53 that abuts on the rear of the circuit board 16 to support the circuit board 16; and a hook 54 for fixing the heat sink 18 to the housing 14 (FIGS. 5 and 7A). The hook 52 and the hook 54 are provided upright on a front side facing the circuit board 16 and the heat sink 18, of the bottom surface 42. A tip portion of the hook 52 has a claw portion 58 that engages with a later-mentioned engaging portion 56 of the circuit board 16. A tip portion of the hook 54 has a claw portion 62 that engages with an engaging portion 60 of the heat sink 18. The leg portion 53 is provided upright on a front side facing the circuit board 16, of the bottom surface 42. The leg portion 53 is formed in a cross shape when the housing 14 is viewed from its front side. Note that the hook 52 configures a second hook 64, the claw portion 58 configures a second claw portion 66, the hook 54 configures a third hook 68, and the claw portion 62 configures a third claw portion 70.

The circuit board 16 includes: the female side connector 34 for connecting to the touch panel display 12; and a connector 72 for connecting the display device 10 and an external device (FIGS. 8A, 8B, and 10). The connector 34 and the connector 72 are arranged on the front side of the circuit board 16.

The circuit board 16 includes: the engaging portion 56 for fixing the circuit board 16 to the housing 14; an engaging portion 74 for fixing the circuit board 16 to the heat sink 18; and a through-hole 76 through which the hook 54 of the housing 14 passes. The engaging portion 56 is formed as an edge portion in an outer periphery of the circuit board 16 or as a hole penetrating through the circuit board 16. The engaging portion 56 engages with the claw portion 58 of the hook 52 of the housing 14 by the circuit board 16 being pressed from the front side against the housing 14. The engaging portion 74 is formed as a hole penetrating through the circuit board 16. The engaging portion 74 engages with a claw portion 80 of a later-mentioned connecting member 78, such as a push pin, of the heat sink 18, by the heat sink 18 being pressed from the front side against the circuit board 16. Note that the engaging portion 56 configures a second engaging portion 81, and the engaging portion 74 configures a first engaging portion 82.

The heat sink 18 is made of aluminum or the like, and includes: a fin 84; the engaging portion 60 for fixing the heat sink 18 to the housing 14; and a cylindrical portion (or a tubular portion) 61 that penetrates through the heat sink 18 (FIGS. 5, 9A, 9B, 11, and 12). Moreover, the heat sink 18 is provided with the connecting member 78, such as a push pin, for fixing the circuit board 16 to the heat sink 18 (FIGS. 5, 9A, 9B, 11, and 12).

The fin 84 is a plate-shaped member projecting from the front of the heat sink 18, and a plurality of the fins 84 are formed so as to be aligned in parallel. Each of the fins 84 is formed extending in a direction inclined with respect to an extending direction of the side wall surface 44 of the housing 14, in a state where the heat sink 18 is housed in the housing 14. The cylindrical portion 61 is a cylindrical member (or a tubular member) projecting from the rear of the heat sink 18, and the cylindrical portion 61 penetrates through the front side and the rear side of the heat sink 18. The connecting member 78 such as a push pin is inserted into the cylindrical portion 61.

The connecting member 78 such as a push pin is made of a resin material, and includes a spring locking portion 90, a shaft portion 92, and the claw portion 80. The connecting member 78 such as a push pin has the spring locking portion 90 at one end of the rod-shaped shaft portion 92, the spring locking portion 90 having a diameter which is larger than that of the shaft portion 92. The shaft portion 92 has, at its other end, the claw portion 80 with which the engaging portion 74 of the circuit board 16 engages. The shaft portion 92 is provided with a spring 94. The claw portion 80 of the connecting member 78 such as a push pin is inserted into the cylindrical portion 61 from the front side toward the rear side thereof, whereby the claw portion 80 engages with the engaging portion 74 of the circuit board 16. The spring 94 is provided in a compressed state between a surface of the cylindrical portion 61 on the front side and the spring locking portion 90, and biases the connecting member 78 such as a push pin toward the front side. As a result, the circuit board 16 is pressed to a heat sink 18 side by the connecting member 78 such as a push pin. Note that the cylindrical portion 61 configures an insertion hole 63, the connecting member 78 such as a push pin configures a first hook 83, the claw portion 80 configures a first claw portion 85, and the spring 94 configures a biasing member 96. The engaging portion 60 is formed as a hole penetrating through the front and the rear of the heat sink 18. The engaging portion 60 engages with the claw portion 62 of the hook 54 of the housing 14 by the heat sink 18 being pressed from the front side against the housing 14. Note that the engaging portion 60 configures a third engaging portion 86.

[Method of Assembling of Display Device]

The display device 10 of the present embodiment is assembled by an unillustrated robot. The robot first installs the circuit board 16 in the housing 14. At this time, the robot places the housing 14 on a work table, with the front side of the housing 14 directed upwardly. The circuit board 16 is pushed against the housing 14 from the front side by the robot, whereby the claw portion 58 of the hook 52 of the housing 14 is engaged with the engaging portion 56 of the circuit board 16 (FIG. 10).

Next, the robot installs the heat sink 18 in the housing 14. The heat sink 18 is pushed against the housing 14 and the circuit board 16 from the front side by the robot, whereby the claw portion 62 of the hook 54 of the housing 14 is engaged with the engaging portion 60 of the heat sink 18 (FIG. 11).

Next, the robot installs the heat sink 18 in the circuit board 16. The robot inserts the connecting member 78 such as a push pin into the cylindrical portion 61 of the heat sink 18 and pushes the connecting member 78 such as a push pin against the circuit board 16 from the front side, whereby the claw portion 80 of the connecting member 78 such as a push pin is engaged with the engaging portion 74 of the circuit board 16 (FIGS. 10 and 11).

Finally, the robot installs the housing 14 in the touch panel display 12 in a state where the circuit board 16 and the heat sink 18 have been installed in the housing 14. At this time, the robot disposes the touch panel display 12 on the work table with the rear of the touch panel display 12 directed upwardly. The robot presses the housing 14 from the rear, while inserting the positioning plate 30 of the touch panel display 12 into the positioning hole 40 of the housing 14. As a result, the claw portion 36 of the housing 14 is engaged with the hook 28 of the touch panel display 12, and the connector 26 of the touch panel display 12 is inserted into the connector 34 of the circuit board 16 and thereby connected to the connector 34 of the circuit board 16.

Note that in the final step, a configuration may be adopted whereby the front of the housing 14 is arranged directed upwardly on the work table, and the touch panel display 12 is pressed from the front to thereby install the housing 14 in the touch panel display 12.

[Operational Advantages]

Although production efficiency of the display device 10 is expected to be improved due to the display device 10 being assembled using a robot, there has been a problem that depending on a method of assembling of the display device 10, production efficiency of the display device 10 cannot be sufficiently improved. For example, when a screw is employed in assembly of the display device 10, a screwdriver or the like needs to be attached to an end effector of the robot, and this is a factor contributing to lowered production efficiency of the display device 10.

Accordingly, in the present embodiment, the touch panel display 12, the heat sink 18, and the circuit board 16 are arranged in a laminated manner. Moreover, a configuration has been adopted whereby two members to be attached to each other, of the touch panel display 12, the heat sink 18, the circuit board 16, and the housing 14 are joined by snap-fitting in a state where, although orientations of front or rear of the two members are different, a pressing direction of one member coincides with that of the other member. As a result, the display device 10 can be assembled without using a screw or the like, and therefore production efficiency of the display device 10 can be improved.

Moreover, in the present embodiment, a configuration has been adopted whereby electrical connection of the touch panel display 12 and the circuit board 16 is performed by connection of the connector 26 and the connector 34. The connector 34 is desirably a floating connector in order to make it possible to tolerate a certain amount of position displacement when connecting the connector 26 and the connector 34.

Moreover, in the present embodiment, although a space occurs between the touch panel display 12 and the circuit board 16, the heat sink 18 is disposed in this space. As a result, thinning of the display device 10 can be achieved.

Moreover, in the present embodiment, the side wall surfaces 44 are provided respectively on the upper side and both of the left and right sides of the housing 14, and each of the side wall surfaces 44 is provided with the communicating port 46. Furthermore, in the present embodiment, the fins 84 of the heat sink 18 are formed so as to extend in a direction inclined with respect to the extending direction of the side wall surface 44 of the housing 14. As a result, even when air flows from an upper side to a lower side or from the lower side to the upper side of the display device 10, or even when air flows from a left side to a right side or from the right side to the left side of the display device 10, air can be supplied and heated air can be discharged efficiently between the fins 84. Hence, the electronic components mounted on the circuit board 16 can be efficiently cooled.

Modified Examples

In the first embodiment, the housing 14 and the circuit board 16 are installed by engaging the claw portion 58 of the hook 52 formed at the housing 14 with the engaging portion 56 formed at the circuit board 16. Instead of this, a hook having a claw portion may be formed on a circuit board 16 side, and an engaging portion for engaging with the claw portion of the hook of the circuit board 16 may be formed in the housing 14.

Moreover, in the first embodiment, the housing 14 and the heat sink 18 are installed by engaging the claw portion 62 of the hook 54 formed at the housing 14 and the engaging portion 60 formed at the heat sink 18. Instead of this, a hook having a claw portion may be formed on a heat sink 18 side, and an engaging portion for engaging with the claw portion of the hook of the heat sink 18 may be formed in the housing 14.

Moreover, in the first embodiment, the housing 14 and the touch panel display 12 are installed by engaging the claw portion 36 formed at the housing 14 and the hook 28 formed at the touch panel display 12. Instead of this, a configuration may be adopted whereby a hook having a claw portion is formed on a touch panel display 12 side, and an engaging portion for engaging with the claw portion of the hook of the touch panel display 12 is formed in the housing 14.

[Technical Concepts Obtained from Embodiment]

Technical concepts understandable from the above-described embodiment will be described below.

The electronic device (20) includes the heat sink (18) configured to cool the electronic component on the circuit board (16). The heat sink (18) and the circuit board (16) are joined by snap-fitting. As a result, production efficiency of the electronic device (20) can be improved.

In the above-described electronic device (20), the heat sink (18) may include the first hook (83) projecting from a surface thereof that faces the circuit board (16), the first hook including the first claw portion (85) at the tip, and the circuit board (16) may include the first engaging portion (82) configured to engage with the first claw portion (85). As a result, the heat sink (18) and the circuit board (16) can be joined by snap-fitting.

In the above-described electronic device (20), the first hook (83) may be formed separately from the heat sink (18), and may be inserted into the insertion hole (63) formed in the heat sink (18), in a state of being movable with respect to the heat sink (18), and the first hook may include the biasing member (96) configured to, in a state where the first claw portion (85) and the first engaging portion (82) are in engagement with each other, bias the first hook (83) in a direction of pressing the circuit board (16) to the heat sink (18). Hence, the circuit board (16) is pressed against the heat sink (18) by the first hook (83), and can thereby be stably held.

In the above-described electronic device (20), there may be further included the housing (14) configured to house therein the heat sink (18) and the circuit board (16). The circuit board (16) and the housing (14) may be joined by snap-fitting, and a direction in which the first hook (83) is pressed when the heat sink (18) and the circuit board (16) are joined, may coincide with a direction in which the circuit board (16) is pressed when the circuit board (16) and the housing (14) are joined. As a result, production efficiency of the electronic device (20) can be improved.

In the above-described electronic device (20), the housing (14) may include the second hook (64) projecting from a surface thereof that faces the circuit board (16), the second hook including a second claw portion (66) at a tip thereof, and the circuit board (16) may include the second engaging portion (81) configured to engage with the second claw portion (66). As a result, the housing (14) and the circuit board (16) can be joined by snap-fitting.

In the above-described electronic device (20), there may be further included the housing (14) configured to house therein the heat sink (18) and the circuit board (16). The heat sink (18) and the housing (14) may be joined by snap-fitting, and a direction in which the first hook (83) is pressed when the heat sink (18) and the circuit board (16) are joined, may coincide with a direction in which the heat sink (18) is pressed when the heat sink (18) and the housing (14) are joined. As a result, production efficiency of the electronic device (20) can be improved.

In the above-described electronic device (20), the housing (14) may include the third hook (68) projecting from a surface thereof that faces the heat sink (18), the third hook including the third claw portion (70) at a tip thereof, and the heat sink (18) may include the third engaging portion (86) configured to engage with the third claw portion (70). As a result, the housing (14) and the heat sink (18) can be joined by snap-fitting.

In the above-described electronic device (20), there may be further included: the housing (14) configured to house therein the heat sink (18) and the circuit board (16); and the main body (33), wherein the heat sink (18), the circuit board (16), and the housing (14) are installed on the rear of the main body in a state where the heat sink (18) and the circuit board (16) are housed in the housing (14). The housing (14) and the main body (33) may be joined by snap-fitting, and a direction in which the first hook (83) is pressed when the heat sink (18) and the circuit board (16) are joined, may coincide with a direction in which the housing (14) or the main body (33) is pressed when the housing (14) and the main body (33) are joined. As a result, production efficiency of the electronic device (20) can be improved.

In the above-described electronic device (20), the housing (14) may include the fourth claw portion (48) projecting from a surface thereof that faces the main body (33), the fourth claw portion including the operating portion (38) at the tip thereof, and the main body (33) may include the fourth hook (32) configured to engage with the fourth claw portion (48). As a result, the housing (14) and the main body (33) can be joined by snap-fitting.

In the above-described electronic device (20), there may be further included the housing (14) configured to house therein the heat sink (18) and the circuit board (16). The heat sink (18) may include the fin (84) projecting from a surface thereof that faces the main body (33) of the electronic device (20). The housing (14) may include, on each of two substantially mutually orthogonal side wall surfaces (44) projecting from a surface of the housing that faces the circuit board (16), the communicating port (46) that communicates with an inside of the housing (14). The fin (84) may be formed so as to extend in a direction inclined with respect to an extending direction of the side wall surfaces (44). As a result, the electronic component mounted on the circuit board (16) can be efficiently cooled.

The present invention is not particularly limited to the embodiments described above, and various modifications are possible without departing from the essence and gist of the present invention.

What is claimed is:

1. An electronic device comprising:
a circuit board including a first engaging portion;
a heat sink configured to cool an electronic component on the circuit board, wherein the heat sink and the circuit board are joined by snap-fitting;
a cylindrical portion formed in the heat sink and extending toward the circuit board, the cylindrical portion having a tip configured to abut the circuit board when the heat sink and the circuit board are joined; and
a first hook projecting from a surface of the heat sink that faces the circuit board, the first hook including a first claw portion at a tip thereof, the first hook being formed separately from the heat sink and is inserted into the cylindrical portion in a state of being movable with respect to the heat sink, the first hook including a biasing member configured to, in a state where the first claw portion and the first engaging portion are in engagement with each other, bias the first hook in a direction of pressing the circuit board to the heat sink.

2. The electronic device according to claim 1, further comprising a housing configured to house therein the heat sink and the circuit board,
wherein the circuit board and the housing are joined by snap-fitting, and a direction in which the first hook is pressed when the heat sink and the circuit board are joined, coincides with a direction in which the circuit board is pressed when the circuit board and the housing are joined.

3. The electronic device according to claim 2, wherein
the housing includes a second hook projecting from a surface thereof that faces the circuit board, the second hook including a second claw portion at a tip thereof, and
the circuit board includes a second engaging portion configured to engage with the second claw portion.

4. The electronic device according to claim 1, further comprising a housing configured to house therein the heat sink and the circuit board,
wherein the heat sink and the housing are joined by snap-fitting, and a direction in which the first hook is pressed when the heat sink and the circuit board are joined, coincides with a direction in which the heat sink is pressed when the heat sink and the housing are joined.

5. The electronic device according to claim 4, wherein
the housing includes a third hook projecting from a surface thereof that faces the heat sink, the third hook including a third claw portion at a tip thereof, and
the heat sink includes a third engaging portion configured to engage with the third claw portion.

6. The electronic device according to claim 1, further comprising:
a housing configured to house therein the heat sink and the circuit board; and
a main body, wherein the heat sink, the circuit board, and the housing are installed on a rear of the main body in a state where the heat sink and the circuit board are housed in the housing,
wherein the housing and the main body are joined by snap-fitting, and a direction in which the first hook is pressed when the heat sink and the circuit board are joined, coincides with a direction in which the housing or the main body is pressed when the housing and the main body are joined.

7. The electronic device according to claim 6, wherein
the housing includes a fourth claw portion projecting from a surface thereof that faces the main body, the fourth claw portion including an operating portion at a tip thereof, and
the main body includes a fourth hook configured to engage with the fourth claw portion.

8. The electronic device according to claim 1, further comprising a housing configured to house therein the heat sink and the circuit board,
wherein the heat sink includes a fin projecting from a surface thereof that faces a main body of the electronic device,
the housing includes, on each of two mutually orthogonal side wall surfaces projecting from a surface of the housing that faces the circuit board, a communicating port that communicates with an inside of the housing, and
the fin is formed so as to extend in a direction inclined with respect to an extending direction of the side wall surface.

* * * * *